United States Patent
Kim et al.

(10) Patent No.: US 7,005,199 B2
(45) Date of Patent: *Feb. 28, 2006

(54) ORGANIC ELECTROLUMINESCENT DEVICES HAVING ENCAPSULATION THIN FILM FORMED BY WET PROCESSING AND METHODS FOR MANUFACTURING THE SAME

(75) Inventors: Gi-heon Kim, Daejeon (KR); Ji-young Oh, Daejeon (KR); Hye-yong Chu, Daejeon (KR); Yong-suk Yang, Daejeon (KR); Jeong-ik Lee, Suwon (KR); Lee-mi Do, Daejeon (KR); Tae-hyoung Zyung, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/392,131

(22) Filed: Mar. 18, 2003

(65) Prior Publication Data

US 2003/0198830 A1    Oct. 23, 2003

(30) Foreign Application Priority Data

Apr. 17, 2002   (KR) .................... 10-2002-0020908

(51) Int. Cl.
*H05B 33/10*   (2006.01)
*H05B 33/04*   (2006.01)

(52) U.S. Cl. ................. 428/690; 428/68; 428/402; 428/403; 428/407; 428/500; 428/917; 313/504; 313/512; 252/301.33

(58) Field of Classification Search .......... 428/690, 428/917, 76, 500, 522, 523, 402, 403, 407, 428/68; 257/100, 88, 99; 313/504, 512; 252/301.33

See application file for complete search history.

(56) References Cited

U.S. PATENT DOCUMENTS

| | | | |
|---|---|---|---|
| 5,395,644 A | | 3/1995 | Affinito |
| 5,414,293 A | * | 5/1995 | Broom ..................... 257/433 |
| 5,427,858 A | * | 6/1995 | Nakamura et al. .......... 428/421 |
| 5,547,508 A | | 8/1996 | Affinito |
| 5,734,225 A | | 3/1998 | Biebuyck et al. |
| 5,855,994 A | * | 1/1999 | Biebuyck et al. ........... 428/209 |
| 5,902,641 A | | 5/1999 | Affinito et al. |
| 5,952,778 A | | 9/1999 | Haskal et al. |
| 6,146,225 A | | 11/2000 | Sheats et al. |

(Continued)

FOREIGN PATENT DOCUMENTS

KR         10-0215768         8/1999

*Primary Examiner*—Rena Dye
*Assistant Examiner*—Camie S. Thompson
(74) *Attorney, Agent, or Firm*—Blakely Sokoloff Taylor & Zafman

(57) ABSTRACT

An organic electroluminescent device with an encapsulation film formed by wet processing and a manufacturing method thereof. The organic electroluminescent device includes a laminate structure including an anode, an organic light emitting layer and a cathode sequentially disposed on a substrate, and an encapsulation film having a polymer layer made of a polymerization product of a vinyl monomer covering the laminate structure. In the method for manufacturing the organic electroluminescent device, a laminate structure including an anode, an organic light emitting layer and a cathode sequentially disposed is formed on a substrate. An organic solution containing a vinyl monomer and a polymerization initiator is coated on the laminate structure. A polymerization reaction is induced to the organic solution coated on the laminate structure, thereby forming an encapsulation film made of a polymer layer on the laminate structure.

9 Claims, 2 Drawing Sheets

U.S. PATENT DOCUMENTS

| | | |
|---|---|---|
| 6,203,854 B1 | 3/2001 | Affinito |
| 6,207,239 B1 | 3/2001 | Affinito |
| 6,217,947 B1 | 4/2001 | Affinito |
| 6,224,948 B1 | 5/2001 | Affinito |
| 6,228,436 B1 | 5/2001 | Affinito |
| 6,268,695 B1 | 7/2001 | Affinito |
| 6,590,157 B1 * | 7/2003 | Boroson et al. ............ 174/52.2 |
| 6,872,473 B1 * | 3/2005 | Song et al. ................. 428/690 |
| 2002/0096995 A1 * | 7/2002 | Mishima et al. ............ 313/506 |
| 2003/0062186 A1 * | 4/2003 | Boroson et al. ............ 174/52.2 |
| 2003/0143423 A1 * | 7/2003 | McCormick et al. ....... 428/690 |
| 2003/0184221 A1 * | 10/2003 | Mishima ..................... 313/512 |
| 2003/0209979 A1 * | 11/2003 | Guenther et al. ........... 313/512 |
| 2004/0024105 A1 * | 2/2004 | Kim et al. ................... 524/492 |
| 2004/0119403 A1 * | 6/2004 | McCormick et al. ....... 313/506 |

* cited by examiner

ORGANIC ELECTROLUMINESCENT DEVICES HAVING ENCAPSULATION THIN FILM FORMED BY WET PROCESSING AND METHODS FOR MANUFACTURING THE SAME

This application claims the priority of Korean Patent Application No. 2002-20908, filed Apr. 17, 2002, in the Korean Intellectual Property Office, the disclosure of which is incorporated herein in its entirety by reference.

BACKGROUND OF THE INVENTION

1. Field of the Invention

The present invention relates to organic electroluminescent devices and methods for manufacturing the same, and more particularly, to organic electroluminescent device having an encapsulation film which can prevent the device from deteriorating and can prolong the life time of the device, and methods for manufacturing the same.

2. Background of the Invention

Organic electroluminescent devices have many advantages including high emission efficiency, wide viewing angle, and fast response speed. However, when reacting with moisture and oxygen in the air, an organic electroluminescent device may slowly deteriorate, resulting in shortened lifetime of the device. Also, electrodes of an organic electroluminescent device may often deteriorate due to oxidation.

To overcome such instability, various methods have been proposed, including, for example, vapor deposition and encapsulation of an organic material or inorganic material, encapsulation of a siloxane-based polymer on an organic electroluminescent device by spin coating or molding, coating paraffin on an organic electroluminescent device by dipping, compounding a polymer film having low transparency of oxygen and moisture and encapsulating the same around an organic electroluminescent device, coating shield glass on a device and filling silicon oil between the device and shield glass in order to shield the device from moisture and oxygen, and the like.

In particular, in order to shield an organic electroluminescent device using a polymer from oxygen and moisture, one of the most widely known encapsulation methods is to use vacuum deposition equipment. For example, known methods include encapsulation of a polymer film by depositing a liquid or solid monomer and polymerizing the same, encapsulation using inorganic material deposition to form an inorganic film, encapsulation using both an organic material and an inorganic material, and the like. Also, John D. Affinito et al., Battelle Memorial Institute, proposed that an organic/inorganic composite layer was formed by vacuum deposition to be employed as an encapsulation film of an organic electroluminescent device (U.S. Pat. Nos. 6,268,695, 6,224,948, 6,207,239, 6,228,436, 5,902,641, 6,217,947, 6,203,854, 5,547,508 and 5,395,644. Also, similar organic/inorganic composite layers formed by vacuum deposition were proposed by Eliav Haskal, International Business Machine (U.S. Pat. No. 5,952,778), James R. Sheats, Agilent Technologies Inc. (U.S. Pat. No. 6,146,225) and so on. These techniques had several advantages in that an encapsulation film having a thickness of 3 $\mu$m or less could be formed, very low transmission to moisture and oxygen could be achieved, and in-line processing could be realized. However, these techniques require expensive vacuum equipment, complicated processing, and an extended processing time and an increased cost compared to encapsulation of the conventional organic electroluminescent device using a metal cap, resulting in various limitations from the viewpoint of actual manufacture applications.

Also, Hans Biebuyck, et al., International Business Machine, proposed encapsulation by spin coating or molding a siloxane-based polymer, as disclosed in U.S. Pat. Nos. 5,855,994 and 5,734,225, which is advantageous in that a siloxane polymer can be used in a state in which it directly contacts an organic light emitting layer. However, the siloxane-based polymer has relatively high transmission to moisture and oxygen, and is prone to deterioration of an organic electroluminescent device during encapsulation, compared to other polymers. Also, the siloxane-based polymer has poor adhesion to an organic material or inorganic material.

In addition, there have been proposed an encapsulation method using heat reactivity, an encapsulation method using a solvent and so on. In the former method, since an organic electroluminescent device is sensitive to heat, the organic electroluminescent device may unavoidably deteriorate due to heat at a predetermined temperature or higher. Also, in the latter method, a solvent permeates into a light-emitting layer, deteriorating an organic electroluminescent device.

SUMMARY OF THE INVENTION

The present invention provides an organic electroluminescent device having an encapsulation structure which can extend a life time of the device by isolating the organic electroluminescent device from moisture and oxygen which may cause deterioration to the device.

The present invention also provides a manufacturing method of an organic electroluminescent device with ensured reliability and processing stability by forming an encapsulation structure in a simple, cost-efficient manner.

In accordance with an aspect of the present invention, there is provided an organic electroluminescent device comprising a laminate structure including an anode, an organic light emitting layer and a cathode sequentially disposed on a substrate, and an encapsulation film having a polymer layer made of a polymerization product of a vinyl monomer covering the laminate structure.

The polymer layer comprises a polymerization product of an acryl-based vinyl monomer, an aromatic vinyl monomer, acrylonitrile-based vinyl monomer, chloride-based vinyl monomer, vinylstearate or vinylpropionate.

Examples of the acryl-based vinyl monomer include one or more mixtures selected from the group consisting of triethylopropane triacrylate, tri(propylene glycol)diacrylate, penthaerithritol triacrylate, trimethylolpropane ethoxylate triacrylate, methyl methacrylate, methacrylate, tri(propylene glycol)glycerolate diacrylate and vinylacrylate.

Examples of the aromatic vinyl monomer include styrene and divinyl benzene.

Examples of the chloride-based vinyl monomer include vinylidene chloride and vinylbenzyl chloride.

The polymer layer may further include a polymerization product of an oligomer having a molecular weight of 300–3000. The oligomer is one or more mixtures selected from the group consisting of urethane acrylate oligomer, acrylate oligomer, ether acrylate oligomer and epoxy acrylate oligomer.

The polymer layer may further include a moisture absorbent for absorbing moisture and oxygen from the air. Examples of the moisture absorbent include calcium, silica gel, zeolite and alkali metal.

In the organic electroluminescent device according to the present invention, the encapsulation film may comprise a polymer layer, and a moisture-absorbing layer formed on the polymer layer for absorbing moisture and oxygen from the air.

In accordance with another aspect of the present invention, there is provided a method for manufacturing an organic electroluminescent device comprising forming a laminate structure including an anode, an organic light emitting layer and a cathode sequentially disposed on a substrate. An organic solution containing a vinyl monomer and a polymerization initiator is coated on the laminate structure. A polymerization reaction is induced to the organic solution coated on the laminate structure, thereby forming an encapsulation film made of a polymer layer on the laminate structure.

The polymerization initiator is a photo initiator, a thermal initiator or an initiator using an oxidation-reduction reaction.

Examples of the polymerization initiator include photo initiators selected from the group consisting of 1-hydroxy-cyclohexyl-phenyl-ketone (Irgacure 907), 2-methyl-1[4-(methylthio)phenyl]-2-morpholinopropane-1-one (Irgacure 184C), 1-hydroxy-2-methyl-1-phenyl-propane-1-one (Darocur 1173), a mixed initiator (Irgacure 500) of Irgacure 184C and benzophenone, a mixed initiator (Irgacure 1000) of Irgacure 184C and Irgacure 1173, 2-hydroxy-1-[4-(2-hydroxyethoxy)phenyl]-2-methyl-1propanone (Irgacure 2959), methylbenzoylformate (Darocure MBF), α,α-dimethoxy-α-phenylacetophenone (Irgacure 651), 2-benzyl-2-(dimethylamino)-1-[4-(4-morpholinyl)phenyl]-1-butanone (Irgacure 369), a mixed initiator (Irgacure 1300) of Irgacure 369 and Irgacure 651, diphenyl(2,4,6-trimethylbenzoyl)-phosphine oxide (Darocur TPO), a mixed initiator (Darocur 4265) of Darocur TPO and Darocur 1173, phosphine oxide, phenyl bis(2,4,6-trimethyl benzoyl) (Irgacure 819), a mixed initiator (Irgacure 2005) of Irgacure 819 and Darocur 1173, a mixed initiator (Irgacure 2010) of Irgacure 819 and Darocur 1173, and a mixed initiator (Irgacure 2020) of Irgacure 819 and Darocur 1173, bis(.eta.5-2,4-cyclopentadien-1-yl)bis[2,6-difluoro-3-(1H-pyrrol-1-yl)phenyl]titanium(Irgacure 784), and a mixed initiator (HSP 188) containing benzophenone.

Also, examples of the polymerization initiator include thermal initiators selected from the group consisting of benzoyl peroxide (BP), acetyl peroxide (AP), diauryl peroxide (DP), di-tert-butyl peroxide (t-BTP), cumyl hydroperoxide (CHP), hydrogen peroxide (HP), potassium peroxide (PP), 2,2'-azobisisobutyronitrile (AIBN), azocompound, and silver alkyls.

Further, the polymerization initiator may initiators utilizing an oxidation-reduction reaction selected from the group consisting of persulfate ($K_2S_2O_8$) and a redox initiator.

Coating of the organic solution is performed by spin coating, bar coating, spreading or dipping.

In the step of forming the encapsulation film, in order to cause a polymerization reaction of the organic solution, light may be irradiated or heat may be applied thereto.

The organic solution may further include a moisture absorbent including calcium, silica gel, zeolite and alkali metal.

The manufacturing method of the organic electroluminescent device according to the present invention may further include forming a moisture-absorbing layer on the polymer layer.

According to the present invention, it is not necessary to separately prepare expensive equipment such as a vacuum chamber or a vacuum pump. Instead, an encapsulation film can be formed using a conventional low-cost vinyl monomer and a polymerization initiator by wet processing in which manufacturability and processing stability can be easily achieved. When forming the encapsulation film, an organic solution comprising a vinyl monomer, a polymerization initiator and an oligomer, is polymerized, thereby enhancing adhesion and hardness of the encapsulation film and denseness of an encapsulation film surface. Therefore, the life time of the organic electroluminescent device can be greatly extended.

BRIEF DESCRIPTION OF THE DRAWINGS

The above aspect and advantages of the present invention will become more apparent by describing in detail preferred embodiments thereof with reference to the attached drawings in which.

DETAILED DESCRIPTION OF THE INVENTION

Figure 1:
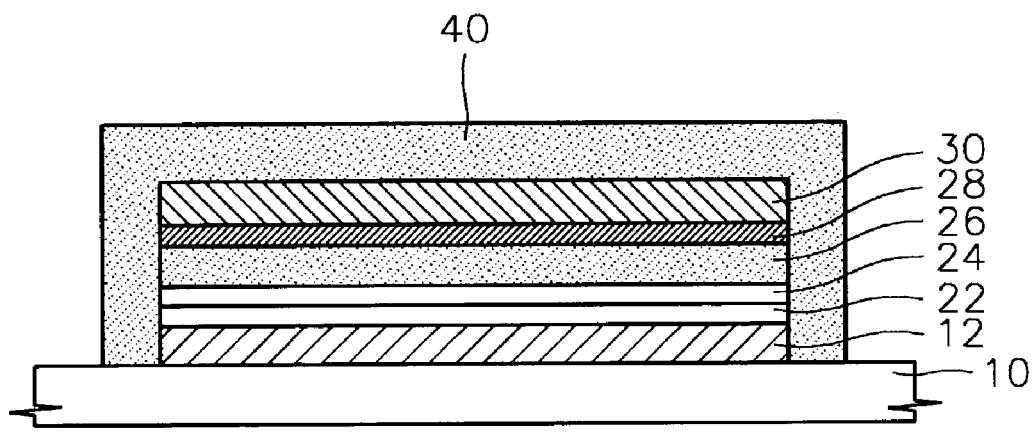
FIG. 1 is a cross-sectional view illustrating a method for manufacturing an organic electroluminescent device according to a first embodiment of the present invention.

Preferred embodiments of the present invention will now be described in detail with reference to the accompanying drawings.

The present invention will now be described more fully hereinafter with reference to the accompanying drawings, in which preferred embodiments of the present invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for purposes of clarity. Also, when it is said that a layer is "on" another layer or a substrate, the layer may directly exist on another layer or a third layer may be interposed therebetween.

FIG. 1 is a cross-sectional view for illustrating a manufacturing method of an organic electroluminescent device according to a first embodiment of the present invention.

Referring to FIG. 1, a transparent electrode 12 is formed on a substrate 10 made of a transparent glass or plastic material. The transparent electrode 12 is made of indium tin oxide (ITO). The transparent electrode 12 includes a first ITO electrode and a second ITO electrode formed at edges of the substrate 10 so as not to be overlapped the central portion on the substrate 10. Next, a hole injection layer 22 and a hole transport layer 24 are sequentially formed on the first ITO electrode of the transparent electrode 12. The hole injection layer 22 and the hole transport layer 24 are formed so as not to be overlapped with the second ITO electrode of the transparent electrode 12. Thereafter, tris-(8-hydroxyquinoline) aluminum ($Alq_3$) is coated on the hole transport layer 24 by vacuum deposition to form a light emitting layer 26 and an electron transport layer 28. Subsequently, a metal, e.g., Al, or an alloy, e.g., LiF, is deposited on the light emitting layer 26 and electron transport layer 28 formed at the central portion of the substrate 10 and on parts of the second ITO electrode of the transparent electrode 12 formed at edges of the substrate 10, thereby forming a metal electrode 30 for a cathode.

Next, in order to encapsulate an organic electroluminescent device having the laminate structure, the laminate structure having the metal electrode 30 is coated with an organic solution containing a vinyl monomer and a polymerization initiator. Here, the organic solution may be coated on the laminate structure by spin coating, bar coating, spreading or dipping.

In the present invention, examples of the vinyl monomer forming the organic solution include acryl-based vinyl monomer, aromatic vinyl monomer, acrylonitrile (AN)-based vinyl monomer, chloride (Cl)-based vinyl monomer, vinyl stearate (VS) and vinyl propionate (VP).

Also, the polymerization initiator forming the organic solution includes a photo initiator, a thermal initiator, or an initiator using an oxidation-reduction reaction.

Further, in order to increase interface adhesion to the metal electrode 30 forming the organic electroluminescent device, hardness, chemical resistance and heat resistance to extend the life time, the organic solution may further include an oligomer having a molecular weight of 300~3000. The oligomer may be selected from the group consisting of urethane acrylate oligomer, acrylate oligomer, ether acrylate oligomer and epoxy acrylate oligomer. If needed, the oligomer may be contained in an amount of 0~80 wt % based on the total weight of the organic solution.

Also, the organic solution may further include a moisture absorbent for absorbing moisture and oxygen from the air. Examples of the moisture absorbent include calcium, silica gel, zeolite and alkali metal.

In order to form an encapsulation film on the laminate structure, the organic solution coated on the laminate structure is polymerized for form a polymer layer 40. Here, in order to induce polymerization of the organic solution, light may be irradiated into or heat may be applied to the organic solution, according to the polymerization initiator used.

In the vinyl monomer forming the organic solution, usable examples of the acryl-based vinyl monomer include triethylopropane triacrylate (TMPTA), tri propylene glycol diacrylate (TPGDA), penthaerithritol triacrylate (PETA), trimethylolpropane ethoxylate triacrylate (TMPEOTA), methyl methacrylate (MMA), methacrylate (MA), tri(propylene glycol) glycerolate diacrylate (TPGGDA) and vinylacrylate (VA).

Also, in the present invention, usable examples of the aromatic vinyl monomer include styrene (ST) and divinyl benzene (DVB).

Further, usable examples of the chloride-based vinyl monomer include vinylidene chloride (VDC) and vinylbenzyl chloride (VBC).

Among polymerization initiators forming the organic solution in the present invention, usable examples of the photo initiator include 1-hydroxy-cyclohexyl-phenyl-ketone (Irgacure 907), 2-methyl-1[4-(methylthio)phenyl]-2-morpholinopropane-1-one (Irgacure 184C), 1-hydroxy-2-methyl-1-phenyl-propane-1-one (Darocur 1173), a mixed initiator (Irgacure 500) of 50 wt % Irgacure 184C and 50 wt % benzophenone, a mixed initiator (Irgacure 1000) of 20 wt % Irgacure 184C and 80 wt % Irgacure 1173, 2-hydroxy-1-[4-(2-hydroxyethoxy)phenyl]-2-methyl-1propanone (Irgacure 2959), methylbenzoylformate (Darocure MBF), α,α-dimethoxy-α-phenylacetophenone (Irgacure 651), 2-benzyl-2-(dimethylamino)-1-[4-(4-morpholinyl)phenyl]-1-butanone (Irgacure 369), a mixed initiator (Irgacure 1300) of 30 wt % Irgacure 369 and 70 wt % Irgacure 651, diphenyl (2,4,6-trimethylbenzoyl)-phosphine oxide (Darocur TPO), a mixed initiator (Darocur 4265) of 50 wt % Darocur TPO and 50 wt % Darocur 1173, phosphine oxide, phenyl bis (2,4, 6-trimethyl benzoyl) (Irgacure 819), a mixed initiator (Irgacure 2005) of 5 wt % Irgacure 819 and 95 wt % Darocur 1173, a mixed initiator (Irgacure 2010) of 10 wt % Irgacure 819 and 90 wt % Darocur 1173, a mixed initiator (Irgacure 2020) of 20 wt % Irgacure 819 and 80 wt % Darocur 1173, bis(.eta.5-2,4-cyclopentadien-1-yl)bis[2,6-difluoro-3-(1H-pyrrol-1-yl)phenyl]titanium (Irgacure 784), and a mixed initiator containing benzophenone (HSP 188, SKUCB Co., Ltd., Korea).

Also, usable examples of the thermal initiator in the present invention include benzoyl peroxide (BP), acetyl peroxide (AP), diauryl peroxide (DP), di-tert-butyl peroxide (t-BTP), cumyl hydroperoxide (CHP), hydrogen peroxide (HP), potassium peroxide (PP), 2,2'-azobisisobutyronitrile (AIBN), azocompound and silver alkyls.

Usable examples of the polymerization initiator using an oxidation-reduction reaction in the present invention include persulfate ($K_2S_2O_8$) and a redox initiator.

Table 1 shows formulas of representative acryl-based vinyl monomers useful in the present invention.

TABLE 1

| TYPE | KIND | STRUCTURE |
|------|------|-----------|
| ACRYL | TMPTA | $H_3C-CH_2-\underset{\underset{O-C(=O)-CH=CH_2}{|}}{\overset{\overset{O-C(=O)-CH=CH_2}{|}}{C}}-CH_2-O-C(=O)-CH=CH_2$ |

TABLE 1-continued
| TYPE | KIND | STRUCTURE |
|------|------|-----------|
|  | PETA | |
|  | TMPEOTA | |
|  | TPGDA | |
|  | MMA | |
|  | MA | |
|  | VA | |
Table 2 shows formulas of representative vinyl monomers useful in the present invention, except acryl-based vinyl monomers.
TABLE 2
| TYPE | KIND | STRUCTURE |
|------|------|-----------|
| AROMATIC | ST | 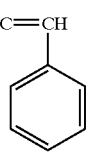 |
TABLE 2-continued
| TYPE | KIND | STRUCTURE |
|------|------|-----------|
|  | DVB | 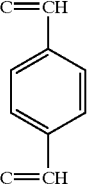 |

TABLE 2-continued

| TYPE | KIND | STRUCTURE |
|---|---|---|
| AN | AN | $H_2C=CH-AN$ |
| Cl | VDC | $H_2C=CCl_2$ |
|  | VBC | $H_2C=CH-C_6H_4-CH_2Cl$ |

Table 3 shows formulas of representative photo initiators useful in the present invention.

TABLE 3

| KIND | STRUCTURE |
|---|---|
| Irgacure 907 |  |
| Irgacure 184C |  |
| Darocur 1173 | 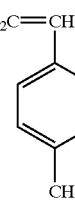 |
| Irgacure 2959 | 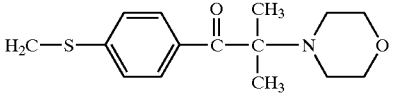 |
| Darocur MBF | 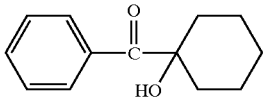 |
| Irgacure 651 | 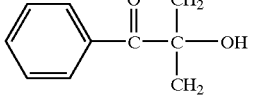 |
| Iragacure 369 | 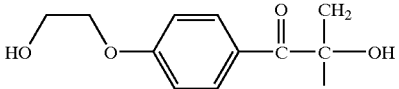 |
| Darocur TPO | 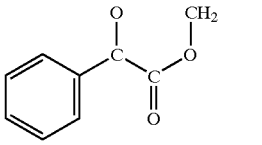 |
| Irgacure 784 | 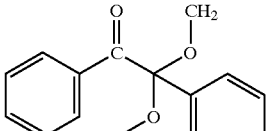 |

Table 4 shows formulas of representative thermal initiators useful in the present invention.

TABLE 4

| KIND | STRUCTURE |
|---|---|
| BP | 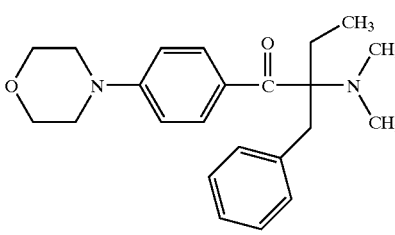 |
| AP | 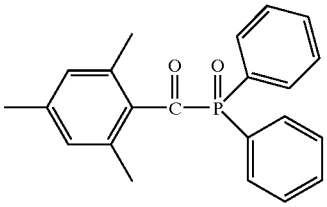 |
| t-BTP | 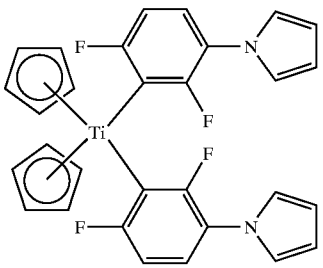 |
| CHP | 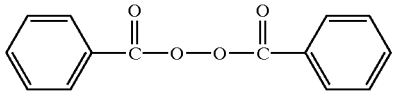 |
| AIBN | 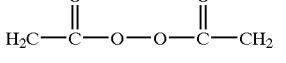 |

Figure 2:
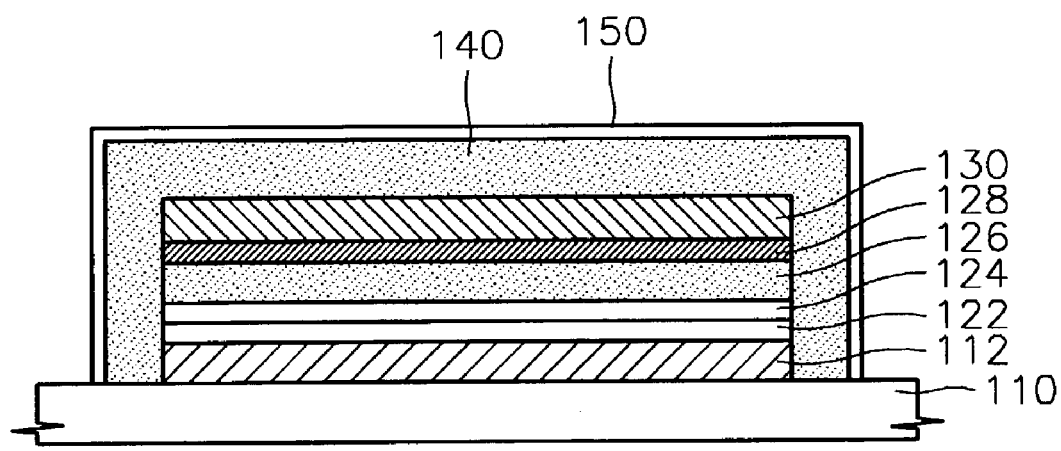
FIG. 2 is a cross-sectional view illustrating a method for manufacturing an organic electroluminescent device according to a second embodiment of the present invention.

FIG. 2 is a cross-sectional view for illustrating a manufacturing method of an organic electroluminescent device according to a second embodiment of the present invention. In this embodiment, an encapsulation film including a polymer layer 140 and a moisture-absorbing layer 150 is formed on a laminate structure of an organic electroluminescent device, which will be described in more detail with reference to FIG. 2. In the same manner as shown in FIG. 1, a laminate structure having a transparent electrode 112, a hole injection layer 122, a hole transport layer 124, a light emitting layer 126, an electron transport layer 128 and a metal electrode 130, is formed on substrate 110. Thereafter, the laminate structure is coated with an organic solution containing a vinyl monomer and a polymerization initiator and polymerized to form a polymer layer 140. The polymer layer 140 can be formed by the same method as that of forming the polymer layer 40 shown in FIG. 1, with a proviso that no moisture absorbent is contained in the organic solution for forming the polymer layer 140 but a separate moisture-absorbing layer 150 is formed on the polymer layer 140. The moisture-absorbing layer 150 is formed for the purpose of absorbing moisture and oxygen in the air, and is made of a material selected from the group consisting of calcium, silica gel, zeolite and alkali metal.

Preferred manufacturing examples of the organic electroluminescent device according to the present invention will now be described in detail.

EXAMPLE 1

In order to form a laminate structure of the organic electroluminescent device shown in FIG. 1, an ITO electrode was formed on a glass substrate, a 30 nm thick 4,4',4"-tris(N-3(3-methylphenyl)-N-phenylamino)triphenylamine (MTDATA) and a 30 nm thick N,N'-diphenyl-N,N'-bis(3-methylphenyl)-(1,1'-biphenyl)-4,4'-diamine (TPD) were sequentially formed thereon as a hole injection layer and a hole transport layer, respectively. Next, a 60 nm thick $Alq_3$ layer was vacuum-deposited to form a green light emitting layer. A 1 nm thick LiF layer and a 100 nm thick Al layer were vacuum-deposited on the light emitting layer to form a metal electrode for a cathode.

A mixed solution of 40 wt % TMPEOTA, 30 wt % TPGDA and 30 wt % epoxy acrylate oligomer (Molecular weight=1000), based on the total weight of the monomer and oligomer, were prepared. Then, 20 wt % HSP188 as a polymerization initiator, based on the total weight of the mixed solution, was mixed with the mixed solution to give an organic solution. The organic solution was spin-coated on the thus-formed laminate structure in the presence of air. Thereafter, light was irradiated into the coated organic solution for polymerization of the organic solution, thereby forming an encapsulation film.

As described above, the organic solution including a monomer, a polymerization initiator and an oligomer, prepared by wet processing, was brought into direct contact with the laminate structure of the organic electroluminescent device, followed by a series of steps for forming an encapsulation film. However, no change in optical properties of the organic electroluminescent device, e.g., luminance or quantization efficiency, was observed between before and after forming the encapsulation film.

Figure 3:
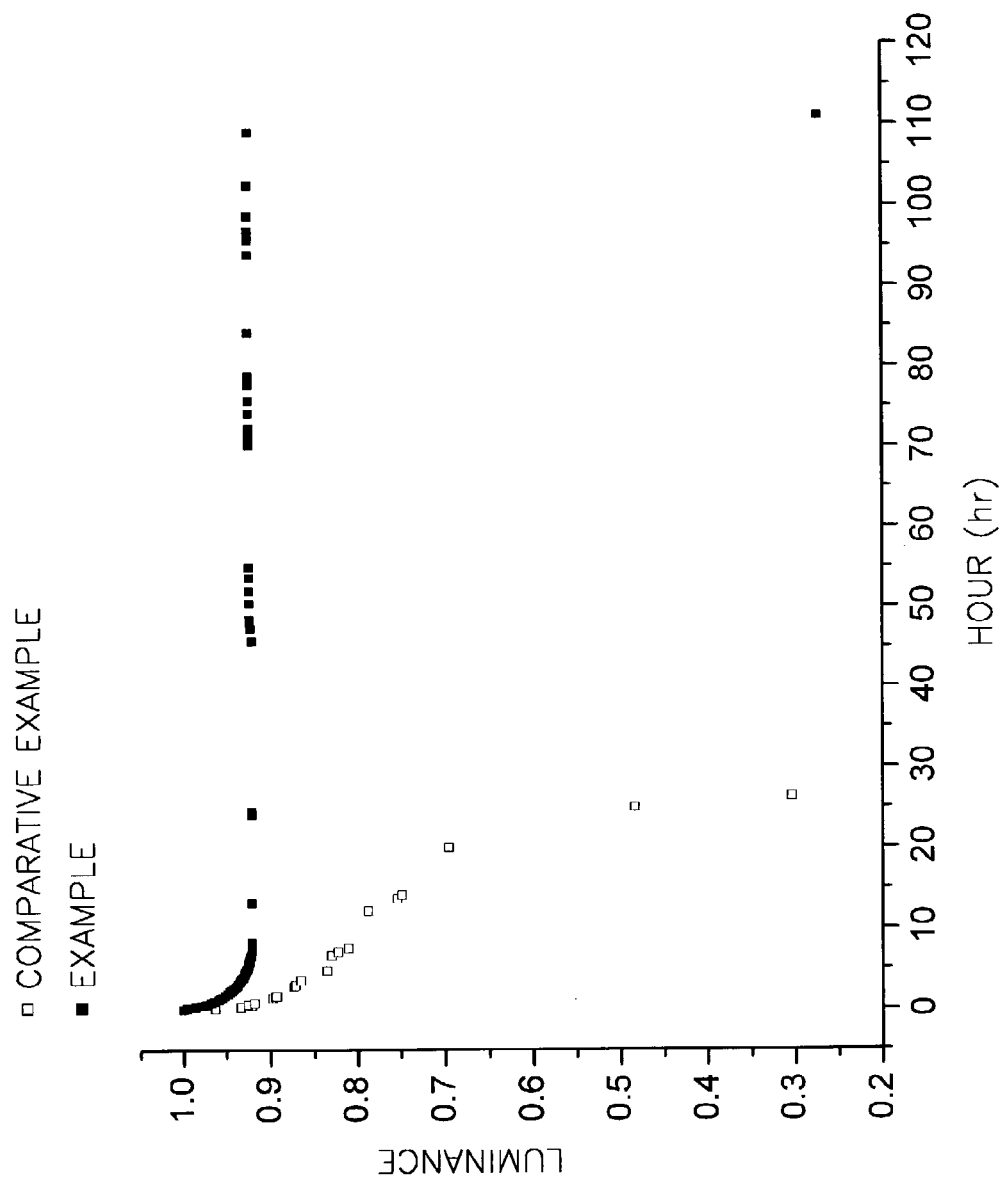
FIG. 3 is a graphical representation of a change in luminance of an organic electroluminescent device according to the present invention over time.

A change in luminance between the organic electroluminescent device according to Example 1 of the present invention and an organic electroluminescent device (Comparative Example) prepared in the same manner as in Example 1, except that an encapsulation film is not formed, was examined over time while applying a constant bias current of 0.1 mA, and the results thereof are shown in Table 5 and FIG. 3.

TABLE 5

|  | Initial Luminance (cd/m$^2$) | Life time (Hr) |
|---|---|---|
| Comparative Example | 104.6 | 24.7 |
| Example | 102.2 | 110.2 |

In Table 5, the term "life time" means a time required until the luminance is reduced to a half the initial luminance. As shown in Table 5, the initial luminances of the devices according to Example and Comparative Example were substantially the same with each other, the organic electroluminescent device prepared in Example of the present invention maintained good luminance characteristics over time, that is, much longer life time than that prepared in Comparative Example, from which it is confirmed that the organic electroluminescent device according to the present invention can be effectively encapsulated by a polymer layer formed by wet processing.

In Example 1, the process of forming the encapsulation film was performed in the presence of air. However, the encapsulation film forming process can be performed in the presence of inert gas in which oxygen and moisture are maximally reduced. In the case where the encapsulation film is formed in the presence of inert gas, the encapsulation film forming process can be more efficiently performed.

EXAMPLE 2

An organic electroluminescent device was manufactured in the same manner as in Example 1, except that a mixed solution of a TMPEOTA monomer and 20 wt % HSP 188 as a polymerization initiator based on the weight of the monomer, was used as an organic solution in order to evaluate the addition effect of epoxy acrylate oligomer (Molecular weight=1000) added for forming an encapsulation film.

The organic solution was prepared in the same manner as in Example 1, coated on the laminate structure, and polymerized to form an encapsulation film to give an organic electroluminescent device. The life time of the organic electroluminescent device was evaluated in the same manner as in Example 1. As the result, the life time of the organic electroluminescent device prepared in Example 2 was 44.8 hours even when a bias current is not applied thereto. Also, an oligomer was added to the organic solution when forming the encapsulation film, thereby increasing adhesion to a metal electrode. Compared to an encapsulation film using only a monomer, the encapsulation film prepared in this example had reduced micro-cracks. These properties greatly affected the life time of an organic electroluminescent device.

EXAMPLE 3

An encapsulation film was further formed on the encapsulation film prepared in Example 2, thereby form a bilayered encapsulation film.

The organic electroluminescent device prepared in Example 3 was evaluated in the same manner as in Example 2, and the life time thereof was 54.3 hours, confirming that the life time of an organic electroluminescent device is dependent upon the thickness of an encapsulation film.

EXAMPLE 4

An organic electroluminescent device was manufactured in the same manner as in Example 2, except that ST was used as a monomer forming an organic solution instead of TMPEOTA and Irgacure 907 was as a polymerization initiator instead of HSP188.

As a result, no change in optical properties of the organic electroluminescent device, e.g., luminance or quantization efficiency, was observed between before and after forming the encapsulation film.

In the organic electroluminescent device according to the present invention, in order to form an encapsulation film, an organic solution containing a vinyl monomer and a polymerization initiator was coated on a laminate structure in which an anode, an organic light emitting layer and a cathode are sequentially disposed and a polymerization reaction was induced to the organic solution to form an encapsulation film on the laminate structure.

According to the present invention, encapsulation film can be manufactured by wet processing in which manufacturability and processing stability are ensured, without separately providing expensive equipment such as a vacuum chamber or a vacuum pump using known, low-cost vinyl monomer and polymerization initiator.

In the case of using a photo initiator as a polymerization initiator during wet processing for forming a encapsulation film, the encapsulation film can be formed only at a desired location by patterning using a mask by which irradiated light can be selectively shielded.

Also, when forming an encapsulation film by wet processing, in order to further extend the life time of an organic electroluminescent device, an oligomer is added in forming an encapsulation film rather than using vinyl monomer only, thereby increasing adhesion and hardness of the encapsulation film and enhancing the denseness of an encapsulation film surface. As a result, the life time of an organic electroluminescent device can be greatly extended.

Further, when forming an encapsulation film by wet processing, a moisture absorbent for absorbing moisture and oxygen from the air may be added to an organic solution for forming an encapsulation film, thereby forming a hybrid encapsulation film. Alternatively, a separate moisture-absorbing layer may be formed on a polymer layer formed by wet processing, thereby extending the life time of an organic electroluminescent device.

The encapsulation film according to the present invention formed by wet processing can be easily applied to fabrication of a large-screen display panel and flexible displays.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. An organic electroluminescent device comprising:
a laminate structure including an anode, an organic light emitting layer and a cathode sequentially disposed on a substrate; and
an encapsulation film having a polymer layer made of a polymerization product of a vinyl monomer covering the laminate structure, wherein the vinyl monomer is at least one of vinyl stearate, vinyl propionate, and vinyl acrylate.

2. The organic electroluminescent device according to claim 1, wherein the polymer layer further includes a polymerization product of an oligomer having a molecular weight of 300~3000.

3. The organic electroluminescent device according to claim 2, wherein the oligomer is one or more mixtures selected from the group consisting of urethane acrylate oligomer, acrylate oligomer, ether acrylate oligomer and epoxy acrylate oligomer.

4. The organic electroluminescent device according to claim 1, wherein the polymer layer further includes a moisture absorbent for absorbing moisture and oxygen from the air.

5. The organic electroluminescent device according to claim 4, wherein the moisture absorbent includes calcium, silica gel, zeolite and alkali metal.

6. The organic electroluminescent device according to claim 1, wherein the encapsulation film comprises the polymer layer, and a moisture-absorbing layer formed on the polymer layer for absorbing moisture and oxygen from the air.

7. An organic electroluminescent device comprising:
a laminate structure including an anodes, an organic light emitting layer and a cathode sequentially disposed on a substrate; and
an encapsulation film having a polymer layer made of a polymerization product of a vinyl monomer covering the laminate structure, wherein the vinyl monomer is at least one of triethylopropane diacrylate and triethylopropane triacrylate.

8. An organic electroluminescent device comprising:
a laminate structure including an anode, an organic light emitting layer and a cathode sequentially disposed on a substrate; and
an encapsulation film having a polymer layer made of a polymerization product of a vinyl monomer covering the laminate structure, wherein the vinyl monomer is at least one of tri(propylene glycol)diacrylate, penthaerithritol triacrylate, trimethylolpropane ethoxylate triacrylate, tri(propylene glycol)glycerolate diacrylate and vinylacrylate.

9. An organic electroluminescent device comprising:
a laminate structure including an anode, art organic light emitting layer and a cathode sequentially disposed on a substrate; and
an encapsulation film having a polymer layer made of a polymerization product of a vinyl monomer covering the laminate structure, wherein the vinyl monomer is at least one of divinyl benzene and vinylbenzyl chloride.

* * * * *